United States Patent
Masago et al.

(10) Patent No.: US 7,460,414 B2
(45) Date of Patent: Dec. 2, 2008

(54) SEMICONDUCTOR DEVICE

(75) Inventors: Noriyuki Masago, Kyoto (JP);
Yoshihiro Tada, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/596,558

(22) PCT Filed: Dec. 14, 2004

(86) PCT No.: PCT/JP2004/018605

§ 371 (c)(1),
(2), (4) Date: Apr. 6, 2007

(87) PCT Pub. No.: WO2005/062311

PCT Pub. Date: Jul. 7, 2005

(65) Prior Publication Data

US 2007/0206412 A1    Sep. 6, 2007

(30) Foreign Application Priority Data

Dec. 18, 2003   (JP) .............................. 2003-421695

(51) Int. Cl.
*G11C 5/14* (2006.01)
(52) U.S. Cl. .................. 365/189.09; 365/194; 365/226
(58) Field of Classification Search ............ 365/189.09, 365/194, 226, 230.06, 63
See application file for complete search history.

(56) References Cited

U.S. PATENT DOCUMENTS 3,798,432 A * 3/1974 Dobson et al. ................ 702/50
4,232,236 A * 11/1980 Yomogida et al. ............. 326/89
4,482,985 A * 11/1984 Itoh et al. .................... 365/226
5,412,601 A * 5/1995 Sawada et al. ......... 365/185.06
2002/0014636 A1   2/2002 Kamei

FOREIGN PATENT DOCUMENTS

| JP | 04-257268 | 9/1992 |
|----|-----------|--------|
| JP | 2000-182373 | 6/2000 |
| JP | 2001-250396 | 9/2001 |
| JP | 2002-008400 | 1/2002 |
| JP | 2003-015753 | 1/2003 |

OTHER PUBLICATIONS

International Search Report issued in the corresponding International Application No. PCT/JP2004/018605, mailed May 10, 2005.

* cited by examiner

*Primary Examiner*—Gene N. Auduong
(74) *Attorney, Agent, or Firm*—Keating & Bennett, LLP

(57) ABSTRACT

A nonvolatile memory device improves the accuracy of screening testing while applying a voltage at or lower than the limit of the withstand voltage of an element for high voltage in the screening testing. The nonvolatile memory device includes a high voltage production circuit that produces a high voltage, a high voltage waveform conversion circuit to which the high voltage is input and which converts the voltage waveform, and a memory cell section provided with memory cells in which data rewriting is performed as a result of applying the converted high voltage. The high voltage waveform conversion circuit includes a test signal input section TEST and applies the high voltage input from the high voltage production circuit to the memory cell section without converting the voltage waveform when a test signal is input to the test signal input section.

5 Claims, 5 Drawing Sheets

SEMICONDUCTOR DEVICE

BACKGROUND OF THE INVENTION

1. Field of the Invention

The present invention relates to a semiconductor device that is suitable for a nonvolatile memory device such as an EEPROM or flash memory that allows data to be rewritten by applying a high voltage to a memory cell.

2. Description of the Related Art

In recent years, EEPROM and flash memory have been widely used for varied program storage or data storage of consumer devices or industrial machinery and so forth. Memory cells constituting EEPROM or flash memory use tunnel currents and hot electrons produced by high voltages (15V, for example) and inject electrons into the floating gate and discharge the electrons from the floating gate. As a result, data rewriting is performed by changing the threshold value of the memory cell.

Furthermore, in general, semiconductor devices fabricated by a semiconductor factory undergo so-called screening testing to remove those semiconductor devices that are probably defective after the same have been shipped with defects. The screening testing is performed under more rigorous conditions than the conditions experienced in normal use, such as high temperature and high voltage conditions beyond the conditions of the warranty, for example. Nonvolatile memory devices such as EEPROM or flash memory also undergo screening testing and a variety of techniques have been proposed such as those that are described in Japanese Patent Application Laid Open No. 2000-182373 and Japanese Patent Application Laid Open No. 2001-250396, for example. The technique described in Japanese Patent Application Laid Open No. 2000-182373 allows high voltages to be obtained in the screening testing and the technique of Japanese Patent Application Laid Open No. 2001-250396 serves to simplify the screening testing.

FIG. 6 shows a block diagram of a conventional nonvolatile memory device 101. The nonvolatile memory device 101 is constituted by a memory cell section 2 in which a plurality of memory cells are provided, an X decoder 5 to which an address signal of a lower address line is input and which selects one word line (or control line) (not shown) of the memory cell section 2, a Y decoder 6 to which an address signal of an upper address line is input and which selects certain memory cells that perform reading or writing within memory cells linked to one word line (or control line), a Y gate 3 to which the output signal of the Y decoder 6 is input and which connects the selected memory cells and a subsequently described data I/O circuit 4, a data I/O circuit 4 that reads data of the memory cells, outputs the data to a data line, and rewrites the memory cell data in accordance with the data signal of the data line; and a high-voltage production circuit 7 that produces a high voltage for data rewriting and outputs the high voltage to the node A in FIG. 6. When the memory cell data are rewritten, the high voltage output by the high voltage production circuit 7 is applied from node A to each of the memory cells of the memory cell section 2 via the X decoder 5 or data I/O circuit 4.

However, the high voltage output by the high voltage production circuit 7 sharply rises at time to when the data rewriting starts as shown by the waveform a of FIG. 7. The sharp rise exerts excess stress on the memory cell and, as a result, the lifespan of the memory cell is shortened.

Further, the elements for high voltage used by peripheral circuits of the memory cell section such as the high voltage production circuit 7 (specifically, the N-type or P-type MOS transistor or the like) operate close to the withstand voltage limit. Therefore, tests using higher high voltages produced or input from the outside in the screening testing were difficult to perform in practice. Hence, in reality, the testing of a memory cell section that includes a plurality of memory cells is a test that implements rigorous conditions such as the supply voltage (not the applied high voltage) and temperature instead of raising the applied high voltage, and the accuracy of the screening testing has been inadequate.

SUMMARY OF THE INVENTION

In order to overcome the problems described above, preferred embodiments of the present invention provide a nonvolatile memory device that allows the stress acting on the memory cell to be alleviated and provide a nonvolatile memory device that allows the accuracy of the screening test to be improved.

In order to solve the above-described problems, the semiconductor device according to a preferred embodiment of the present invention is a semiconductor device including a high voltage production circuit that produces a high voltage, and a high voltage waveform conversion circuit provided at the subsequent stage of the high voltage production circuit that gradually outputs a high voltage by converting the waveform of the high voltage of the high voltage production circuit.

This semiconductor device preferably also includes a memory cell in which data rewriting is performed by using a high voltage, wherein the high voltage waveform conversion circuit gradually applies the high voltage to the memory cell.

The high voltage waveform conversion circuit of the semiconductor device preferably includes a delay circuit that delays the high voltage of the high voltage production circuit, and a voltage conversion switching element that lowers the delayed high voltage by a predetermined value.

The voltage conversion switching element of the semiconductor device is preferably an N-type MOS transistor in which the high voltage delayed by the delay circuit is input to the gate thereof and the high voltage that has undergone conversion by being lowered by a predetermined value is output from the source thereof.

In a semiconductor device according to another preferred embodiment of the present invention, the high voltage waveform conversion circuit further includes a test signal input section and, when a test signal is input to the test signal input section, the high voltage waveform conversion circuit outputs the high voltage of the high voltage production circuit without converting the waveform.

The high voltage waveform conversion circuit of the semiconductor device preferably includes a delay circuit that delays the high voltage of the high voltage production circuit, a voltage conversion switching element that lowers the delayed high voltage by a predetermined value, and a short-circuit switching element provided parallel to the voltage conversion switching element that short-circuits the voltage conversion switching element when the test signal is input to the test signal input section.

The voltage conversion switching element of the semiconductor device is preferably an N-type MOS transistor in which the high voltage delayed by the delay circuit is input to the gate thereof and the high voltage that has undergone conversion by being lowered by a predetermined value is output from the source, and the short-circuit switching element is a P-type MOS transistor that is turned ON and outputs the high voltage of the high voltage production circuit as is when the test signal is input to the test signal input section.

The semiconductor device according to various preferred embodiments of the present invention allows the stress acting on a downstream circuit to which a high voltage is applied and, more specifically, the memory cell in the case of a nonvolatile memory device, to be alleviated by providing a high voltage waveform conversion circuit. Further, the semiconductor device according to another preferred embodiment of the present invention applies a high voltage of a high voltage production circuit to a memory cell or other circuit as is when a test signal is input to the high voltage waveform conversion circuit and, therefore, the accuracy of the screening testing can be improved.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
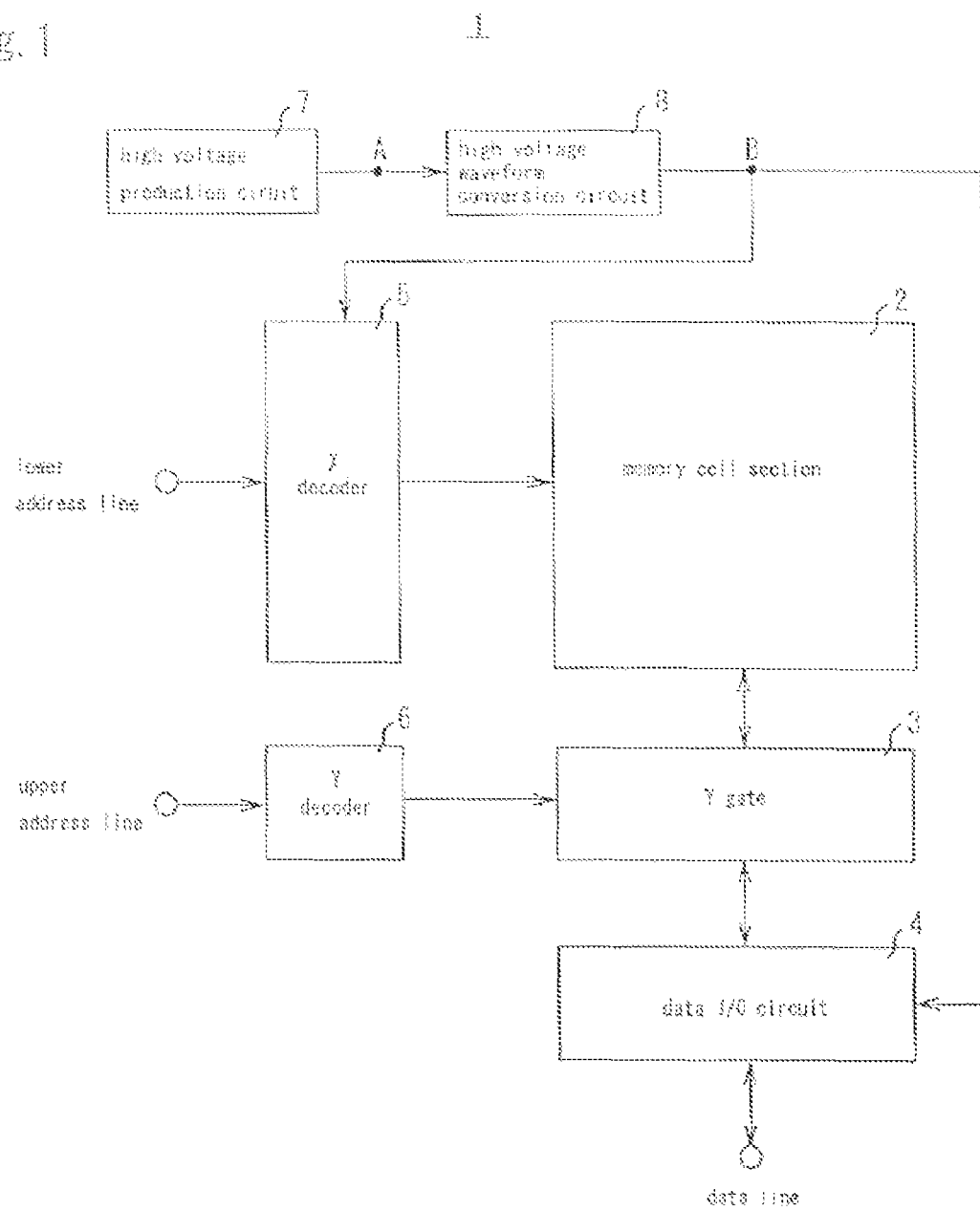
FIG. 1 is a block diagram of a nonvolatile memory device according to a preferred embodiment of the present invention.

Preferred embodiments of the present invention will be described hereinbelow with reference to the drawings. FIG. 1 is a block diagram of a preferred embodiment in a case where the semiconductor device of the present invention is applied to a nonvolatile memory device. The nonvolatile memory device 1 preferably includes, as per the conventional nonvolatile memory device 101 described above, a memory cell section 2 provided with a plurality of memory cells, an X decoder 5 to which an address signal of a lower address line is input and which selects one word line (or control line) (not illustrated) of a memory cell section 2, a Y decoder 6 to which an address signal of an upper address line is input and which selects certain memory cells that perform reading or rewriting within the memory cells linked to the one word line (or control line), a Y gate 3 to which the output signal of the Y decoder 6 is input and which connects the selected memory cells and the data I/O circuit 4, a data I/O circuit 4 that reads memory cell data, outputs the memory cell data to a data line, and rewrites the memory cell data in accordance with the data signal of the data line, and a high voltage production circuit 7 that produces a high voltage for data rewriting and outputs the high voltage to node A in FIG. 1.

Further, the nonvolatile memory device 1 also preferably includes a high voltage waveform conversion circuit 8 that is provided at the subsequent stage of the high voltage production circuit 7 (that is, at the stage that follows node A). The high voltage waveform conversion circuit 8 converts the waveform of the high voltage of the high voltage production circuit that is input via node A and outputs the converted waveform to node B. When the memory cell data are rewritten, a high voltage is gradually applied from node B to the memory cell via the X decoder 5 or data I/O circuit 4.

Figure 2:
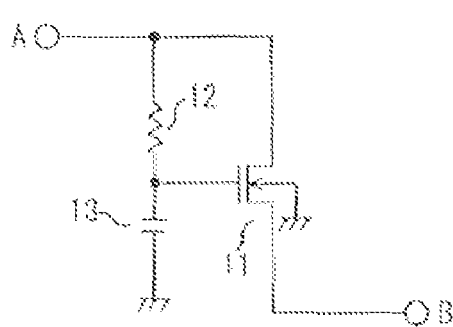
FIG. 2 is a circuit diagram of a high voltage waveform conversion circuit of the nonvolatile memory device of FIG. 1.

FIG. 2 is a circuit diagram of the high voltage waveform conversion circuit 8. One end of the resistor 12 and the drain of the N-type MOS transistor 11 are connected to the input terminal A corresponding with node A in FIG. 1 in the high voltage waveform conversion circuit 8. The other end of the resistor 12 is connected to the gate of the N-type MOS transistor 11 and to a capacitor 13 the other end of which is grounded. The source of the N-type MOS transistor 11 is connected to an output terminal B that corresponds with node B in FIG. 1. Here, the resistor 12 and capacitor 13 constitute a delay circuit that delays the high voltage input from the high voltage production circuit 7. Further, the N-type MOS transistor 11 is a source follower constitution and constitutes a voltage conversion switching element that lowers the delayed high voltage by a predetermined value.

Figure 3:
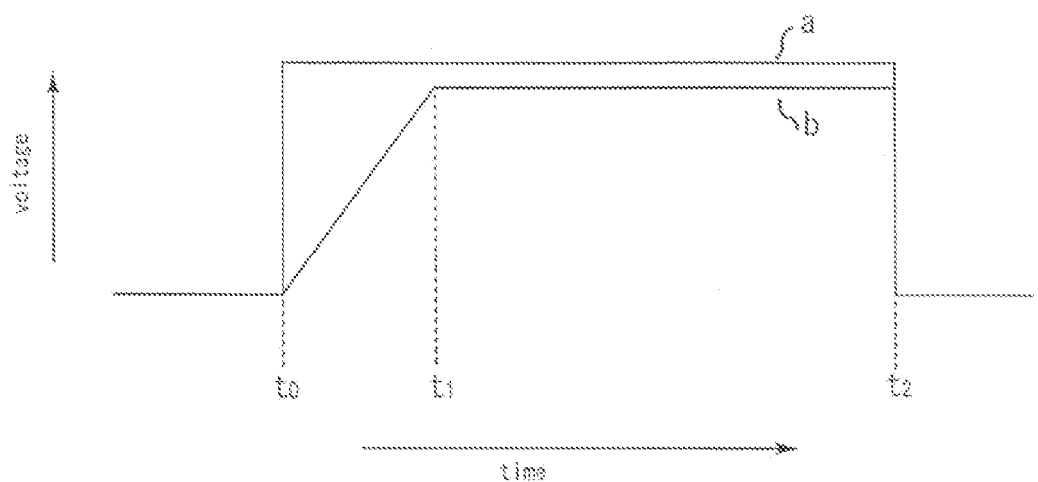
FIG. 3 is an operating waveform diagram of the high voltage waveform conversion circuit of the nonvolatile memory device of FIG. 1.

FIG. 3 shows a voltage waveform of the input terminal A and output terminal B in the high voltage waveform conversion circuit 8. When a high voltage (waveform a) input to the input terminal A rises (time $t_0$), the gate voltage of the N-type MOS transistor 11 is delayed by the resistor 12 and capacitor 13 and rises to the top about 500 μS later (time $t_1$), for example. Further, the source voltage of the N-type MOS transistor 11 having a source-follower constitution is held at a voltage that is lowered by the threshold value voltage of the N-type MOS transistor 11 from the gate voltage. Therefore, the voltage (waveform b) of the output terminal B rises in step with the gate voltage of the N-type MOS transistor 11 (that is, rises to the top about 500 μS later (time $t_1$), for example) and, after rising, is at a voltage lowered by the threshold value voltage of the N-type MOS transistor 11 below the voltage of the input terminal A. Thereafter, when the voltage of the input terminal A drops (time $t_2$), the voltage of the output terminal B drops in step with the drain voltage (that is, the voltage of the input terminal A) since the N-type MOS transistor 11 is ON.

Thus, in the nonvolatile memory device 1, the high voltage of the high voltage production circuit 7 is converted by the high voltage waveform conversion circuit 8 so that the rise is slow and the high voltage is gradually applied to the respective memory cells of the memory cell section 2. As a result, the stress acting on the memory cell is alleviated.

Figure 4:
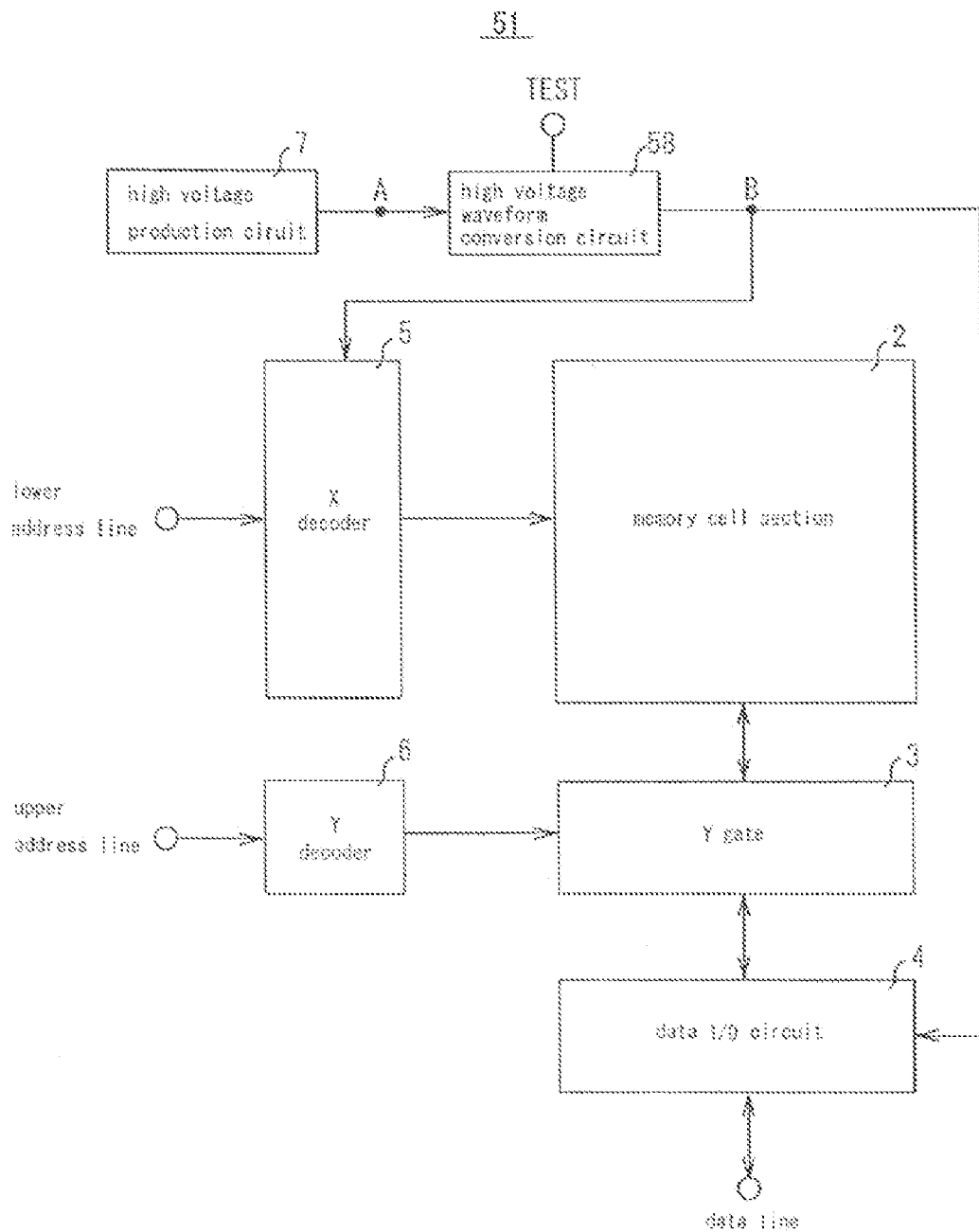
FIG. 4 is a block diagram of a nonvolatile memory device according to another preferred embodiment of the present invention.

Another preferred embodiment of a nonvolatile memory device of the present invention will be described next. FIG. 4 shows a block diagram of a nonvolatile memory device 51. The nonvolatile memory device 51 preferably includes a high voltage waveform conversion circuit 58 with a test signal input section TEST instead of the high voltage waveform conversion circuit 8 of the nonvolatile memory device 1 in FIG. 1. When a test signal is input to the test signal input section TEST (during screening testing), the voltage waveform conversion circuit 58 applies the waveform of the high voltage of the high voltage production circuit 7 to the memory cell of the memory cell section 2 without performing waveform conversion. That is, a high voltage whose waveform has been converted by the high voltage waveform conversion circuit 58 is applied from node B to the respective memory cells of the memory cell section 2 via the X decoder 5 or data I/O circuit 4 when the data of the memory cell is rewritten, usually when a test signal is not input and a high voltage whose waveform has not been converted is applied when the data of the memory cells is rewritten during screening testing.

Figure 5:
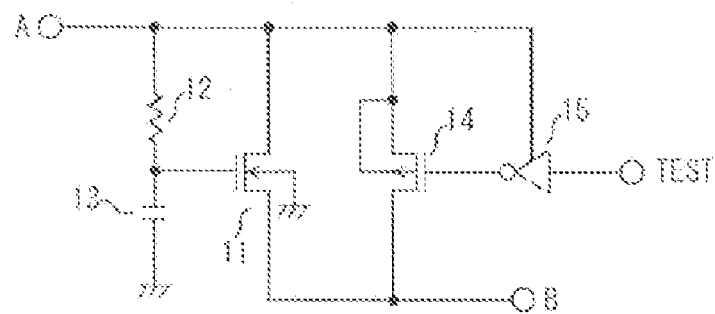
FIG. 5 is a circuit diagram of the high voltage waveform conversion circuit of the nonvolatile memory device of FIG. 4.
Figure 6:
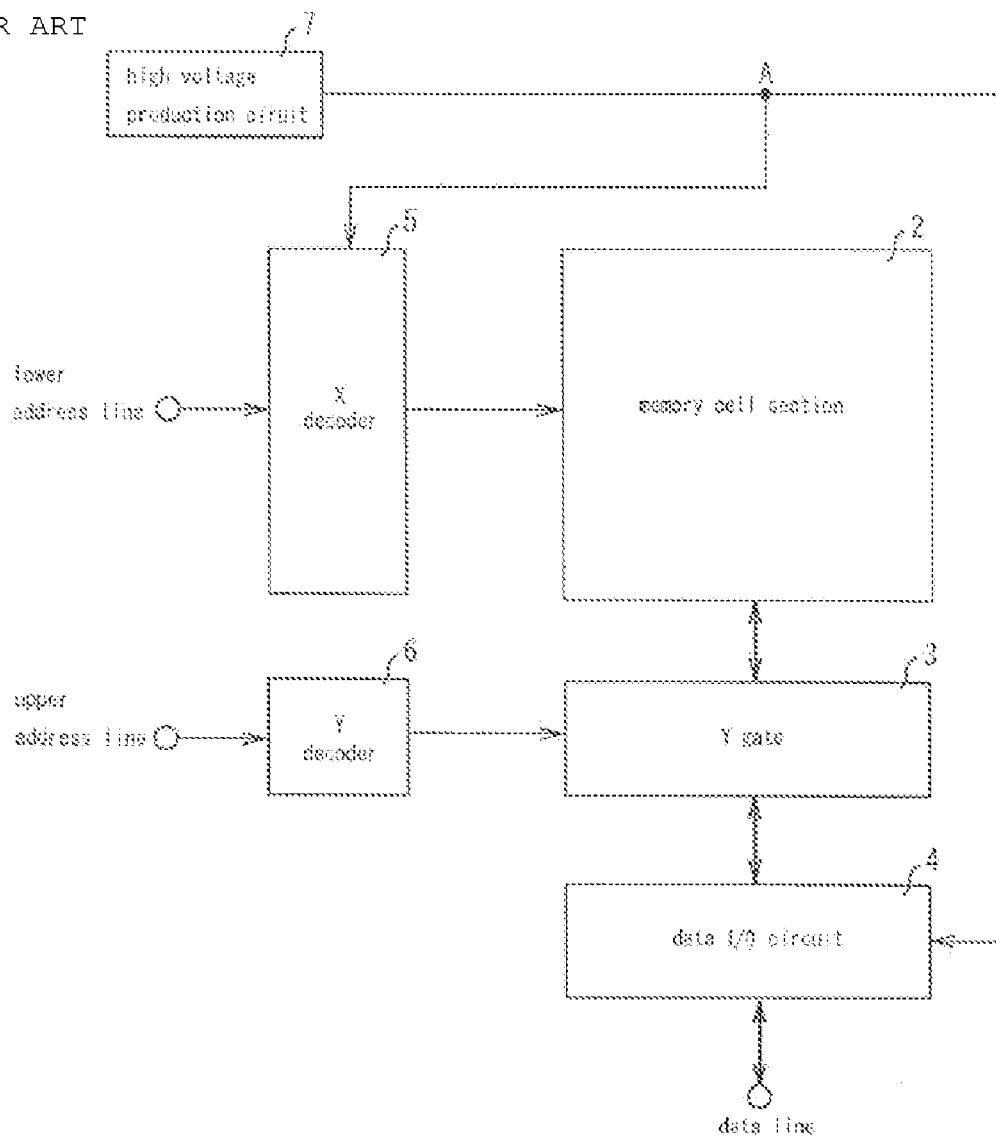
FIG. 6 is a block diagram of a nonvolatile memory device of the prior art.
Figure 7:
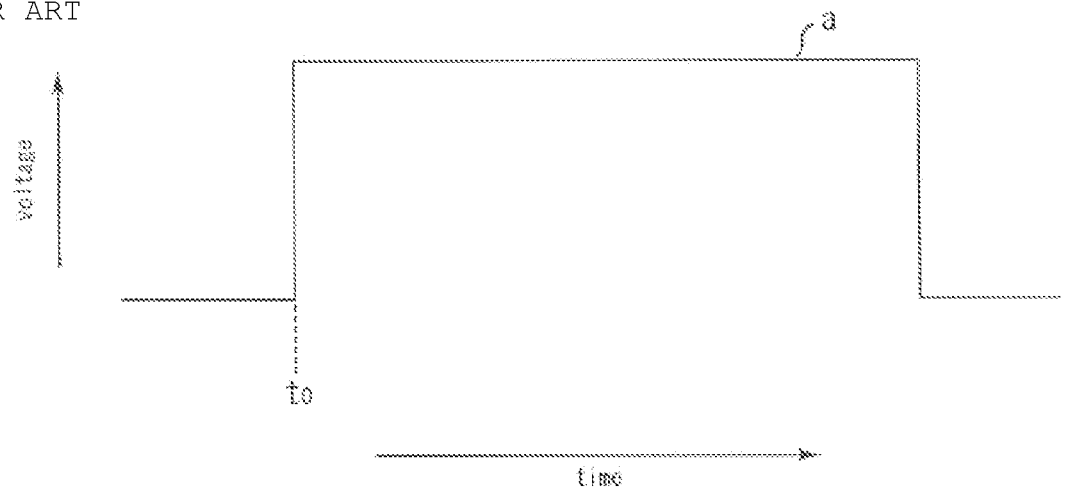
FIG. 7 is a waveform diagram of a voltage output by the high voltage production circuit of the nonvolatile memory device of FIG. 6.

FIG. 5 is a circuit diagram of the high voltage waveform conversion circuit 58. The high voltage waveform conversion circuit 58 differs from the high voltage waveform conversion circuit 8 of FIG. 2 in that the high voltage waveform conversion circuit 58 includes the test signal input section TEST and in that a P-type MOS transistor 14, the gate of which is connected to the output of the inverter 15 that inverts the level of the test signal input section TEST, is provided parallel to the N-type MOS transistor 11. That is, the following constitution is added to the constitution in FIG. 2 of the high voltage waveform conversion circuit 58. The source of the P-type MOS transistor 14 and the power supply of the inverter 15 are connected to the input terminal A. The gate of the P-type MOS transistor 14 is connected to the output of the inverter 15 as mentioned earlier and the input of the inverter 15 is connected to the test signal input section TEST. The drain of the P-type MOS transistor 14 is connected to the source of the N-type MOS transistor 11. Here, when a test signal is input to the test signal input section TEST, the P-type MOS transistor 14 is a short-circuit switching element that short-circuits the N-type MOS transistor 11 constituting a voltage conversion switching element.

Usually, when the test signal input section TEST is at the low level, the P-type MOS transistor 14 is OFF. The voltage of the output terminal B in this case is shown by the waveform b in FIG. 3. On the other hand, during screening testing, the test signal input section TEST inputs a test signal and is at the high level, and the P-type MOS transistor 14 is ON and the high voltage of the high voltage production circuit 7 is output as is. In other words, because the N-type MOS transistor 11 is short-circuited, the voltage of the output terminal B is substantially equal to the voltage of the input terminal A. That is, during the screening testing, the voltage of the output terminal B is shown by waveform a in FIG. 3.

Thus, usually, the high voltage waveform conversion circuit 58 is able to alleviate the stress acting on the memory cells by converting the high voltage of the high voltage production circuit 7 so that the rise is gradual and then applying the converted high voltage to the respective memory cells of the memory cell section 2. On the other hand, during screening testing, the stress acting on the memory cells can be increased by applying the high voltage of the high voltage production circuit 7, that is, a high voltage with a sharp rise and a voltage value that is higher than normal to the respective memory cells of the memory cell section 2 as is. Here, during screening testing, the voltages at which the elements for high voltage used in the peripheral circuits of the memory cell section 2 such as the high voltage production circuit 7 and the high voltage waveform conversion circuit 58 and so forth operate are substantially the same as the voltages normally used. Therefore, voltages exceeding the limit of the withstand voltage are not applied to the elements for high voltage. Thus, the accuracy of the screening testing can be improved by raising the stress exerted by the high voltage applied to the memory cell section 2 as far as possible while applying voltages at or below the limit of the withstand voltage of the elements for high voltage in the screening testing.

Further, the present invention is not limited to the above-described preferred embodiments and a variety of design modifications within the scope of the items appearing in the claims are possible. For example, the delay circuit of the high voltage waveform conversion circuits 8, 58 can also be constituted by using a constant current source instead of the resistor 12. Moreover, although a nonvolatile memory device was described above with respect to the preferred embodiments of the present invention, the present invention is not limited to a nonvolatile memory device and can also be applied to another semiconductor device that comprises a high voltage production circuit that produces a high voltage.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A semiconductor device comprising:
   a high voltage production circuit that produces a high voltage; and
   a high voltage waveform conversion circuit provided at a subsequent stage of the high voltage production circuit that gradually outputs a high voltage by converting the waveform of the high voltage of the high voltage production circuit, the high voltage waveform conversion circuit including a delay circuit that delays the high voltage of the high voltage production circuit, and a voltage conversion switching element that lowers the delayed high voltage by a predetermined value; and
   a memory cell in which data rewriting is performed by using the high voltage output by the high voltage waveform conversion circuit.

2. The semiconductor device according to claim 1, wherein the voltage conversion switching element is an N-type MOS transistor in which the high voltage delayed by the delay circuit is input to a gate thereof and the high voltage that has undergone conversion by being lowered by a predetermined value is output from a source thereof.

3. The semiconductor device according to claim 1, wherein the high voltage waveform conversion circuit comprises a test signal input section and, when a test signal is input to the test signal input section, the high voltage waveform conversion circuit outputs the high voltage of the high voltage production circuit without converting the waveform.

4. The semiconductor device according to claim 3, wherein the high voltage waveform conversion circuit comprises a short-circuit switching element provided parallel to the voltage conversion switching element that short-circuits the voltage conversion switching element when the test signal is input to the test signal input section.

5. The semiconductor device according to claim 4, wherein the voltage conversion switching element is an N-type MOS transistor in which the high voltage delayed by the delay circuit is input to the gate thereof and the high voltage that has undergone conversion by being lowered by a predetermined value is output from the source thereof, and the short-circuit switching element is a P-type MOS transistor that is turned ON and outputs the high voltage of the high voltage production circuit as is when the test signal is input to the test signal input section.

* * * * *